United States Patent
Miyazaki et al.

(10) Patent No.: US 8,378,444 B2
(45) Date of Patent: Feb. 19, 2013

(54) PHOTODIODE AND METHOD OF FABRICATING PHOTODIODE

(75) Inventors: Kenichi Miyazaki, Kyoto-fu (JP); Osamu Matsushima, Kyoto-fu (JP)

(73) Assignee: Rohm Co., Ltd., Kyoto-fu (JP)

( * ) Notice: Subject to any disclaimer, the term of this patent is extended or adjusted under 35 U.S.C. 154(b) by 132 days.

(21) Appl. No.: 12/781,850

(22) Filed: May 18, 2010

(65) Prior Publication Data
US 2010/0295145 A1    Nov. 25, 2010

(30) Foreign Application Priority Data

May 19, 2009 (JP) ................... 2009-120769
Dec. 28, 2009 (JP) ................... 2009-297205

(51) Int. Cl.
*H01L 29/76* (2006.01)
(52) U.S. Cl. ........... 257/458; 257/9; 257/76; 257/94; 257/103; 257/184; 257/200; 257/461; 257/613
(58) Field of Classification Search .......... 257/9, 76, 257/94, 103, 184, 200, 458, 461, 613
See application file for complete search history.

(56) References Cited

U.S. PATENT DOCUMENTS

| 5,436,204 A | 7/1995 | Albin et al. |
| 5,441,897 A | 8/1995 | Noufi et al. |
| 5,754,714 A * | 5/1998 | Suzuki et al. ............... 385/5 |
| 2011/0204320 A1 * | 8/2011 | Fox et al. ............... 257/9 |

FOREIGN PATENT DOCUMENTS

| JP | 2007-123720 | 5/2007 |
| JP | 2007-123721 | 5/2007 |

OTHER PUBLICATIONS

Niki et al., "Effects of the surface $Cu_{2-x}Se$ phase on the growth and properties of $CuInSe_2$ films", Applied Physics Letters 74(11): 1630-1632 (1999).

* cited by examiner

*Primary Examiner* — Edward Wojciechowicz
(74) *Attorney, Agent, or Firm* — Fish & Richardson P.C.

(57) ABSTRACT

A light-absorbing layer is composed of a compound-semiconductor film of chalcopyrite structure, a surface layer is disposed on the light-absorbing layer, the surface layer having a higher band gap energy than the compound-semiconductor film, an upper electrode layer is disposed on the surface layer, and a lower electrode layer is disposed on a backside of the light-absorbing layer in opposition to the upper electrode layer, the upper electrode layer and the lower electrode layer having a reverse bias voltage applied in between to detect electric charges produced by photoelectric conversion in the compound-semiconductor film, as electric charges due to photoelectric conversion are multiplied by impact ionization, while the multiplication by impact ionization of electric charges is induced by application of a high-intensity electric field to a semiconductor of chalcopyrite structure, allowing for an improved dark-current property, and an enhanced efficiency even in detection of low illumination intensities, with an enhanced S/N ratio.

13 Claims, 13 Drawing Sheets

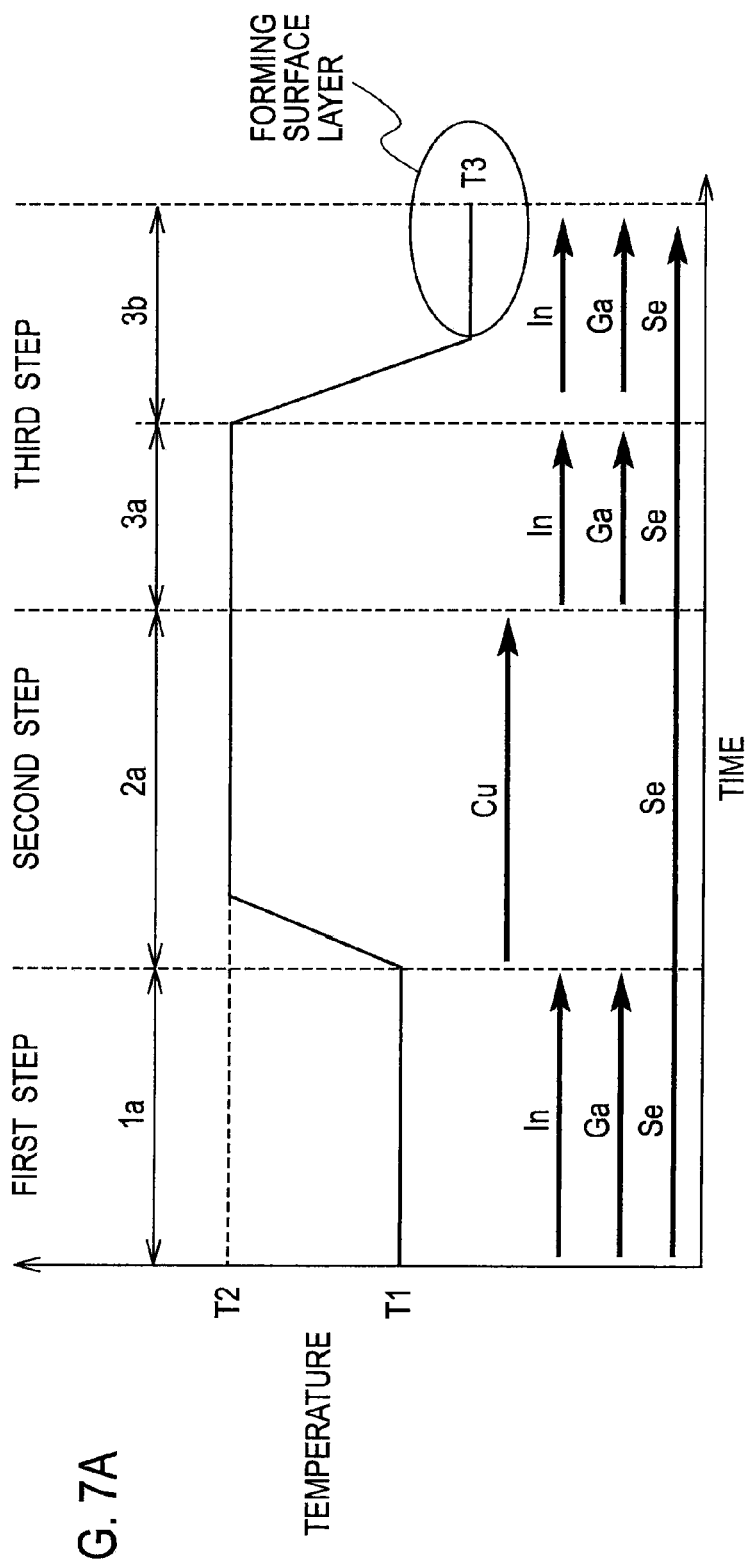
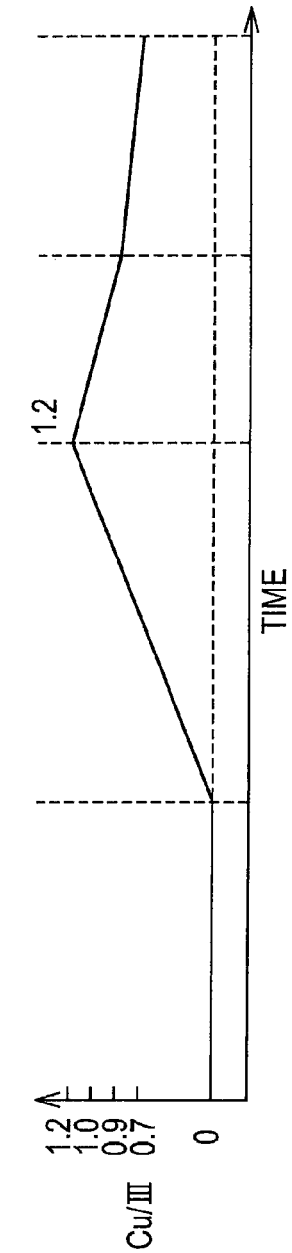
FIG. 7A
FIG. 7B

FIG. 18A
FIG. 18B
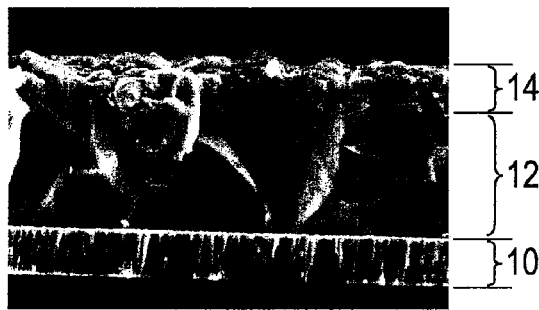
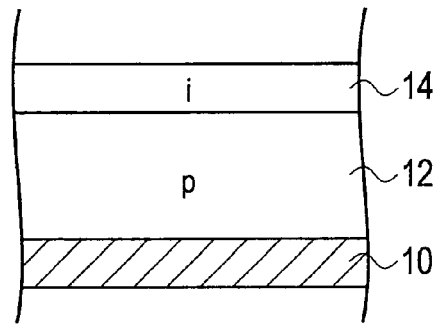
FIG. 19
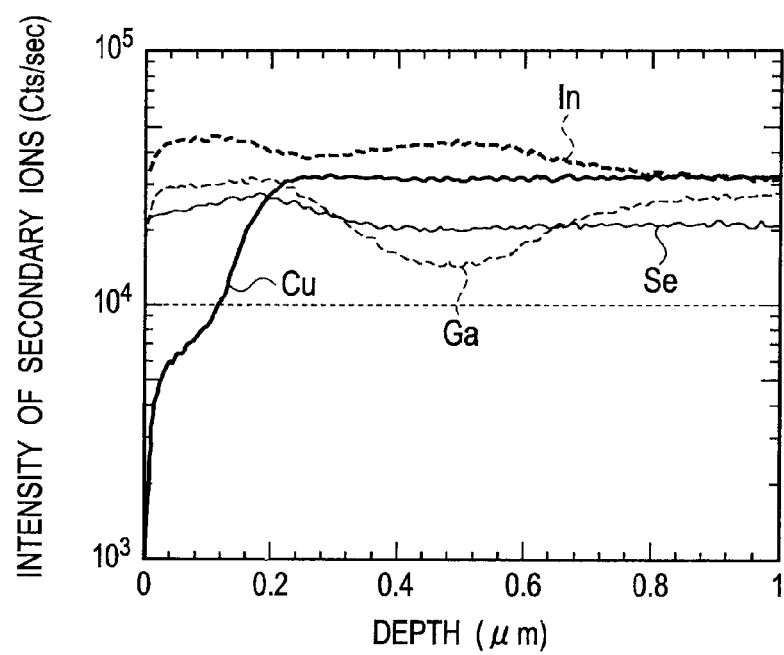

PHOTODIODE AND METHOD OF FABRICATING PHOTODIODE

CROSS REFERENCE TO RELATED APPLICATIONS AND INCORPORATION BY REFERENCE

This application is based upon and claims the benefits of priority from prior Japanese Patent Application Nos. P2009-120769 and P2009-297205 filed on May 19, 2009, and Dec. 28, 2009, respectively, the entire contents of which are incorporated herein by reference.

TECHNICAL FIELD

The present invention relates to a photodiode and a fabrication method thereof, and particularly, to a photodiode including a compound-semiconductor film of chalcopyrite structure and adapted for favorable wavelength sensitivity, low dark current, and low-voltage operation, and a fabrication method thereof.

BACKGROUND ART

There have been thin-film solar cells including a light-absorbing layer using: $CuInSe_2$ being a compound-semiconductor film of a chalcopyrite structure composed of a Group-Ib, a Group-IIIb, and a Group-VIb element (that is a CIS-based film); or $Cu(In, Ga)Se_2$ being a solid solution thereof with Ga as a solute (that is a CIGS-based film). They have been adapted for high efficiencies of energy conversion with reduced deteriorations of efficiency such as due to light irradiation, as an advantage.

There have been literatures (cf. Patent Literature 1 and Patent Literature 2) disclosing photoelectric conversion devices employing a compound-semiconductor film of chalcopyrite structure with a greatly reduced dark current, and fabrication methods thereof.

Also, there have been literatures (cf. Patent Literature 3 and Patent Literature 4) disclosing methods of formation such as by selenidation of a high-quality CIGS-based film.

Also, there has been a literature (cf. Non-Patent Literature 1) disclosing effects of surface $Cu_{2-x}Se$ layers on growth and properties of $CuInSe_2$ films.

CITATION LIST

Patent Literature 1: Japanese Patent Application Laying-Open Publication No. 2007-123720
Patent Literature 2: Japanese Patent Application Laying-Open Publication No. 2007-123721
Patent Literature 3: U.S. Pat. No. 5,436,204
Patent Literature 4: U.S. Pat. No. 5,441,897
Non-Patent Literature 1: S. Niki, et al.: "Effects of the surface $Cu_{2-x}Se$ phase on the growth and properties of $CuInSe_2$ films", APPLIED PHYSICS LETTERS, VOLUME 74, Number 11, 15 MARCH 1999, pp. 1630-1632

SUMMARY OF THE INVENTION

Technical Problem

CIS-based films and CIGS-based films have their applications now mainstreaming to solar cells.

The inventors focused attentions on those compound-semiconductor film materials having high light-absorption coefficients, as well as their characteristic high-sensitivities over wide bands ranging from visible wavelengths to near-infrared wavelengths, and examined use of them as a photodiode. As an issue on the way, there was a conductive CuSe layer appearing on a surface of once-made CIGS-based film, causing an increased dark current.

It is an object of the present invention to provide a photodiode and a fabrication method thereof, the photodiode being adapted for a favorable characteristic of wavelength sensitivity, with a suppressed Cu precipitation on a surface of as-made CIGS film, allowing for low dark-current and low-voltage operation.

Solution to Problem

To achieve the object, according to an aspect of the present invention, there is a photodiode comprising a light-absorbing layer composed of a compound-semiconductor film of chalcopyrite structure, a surface layer disposed on the light-absorbing layer, the surface layer having a higher band gap energy than the compound-semiconductor film, an upper electrode layer disposed on the surface layer, and a lower electrode layer disposed on a backside of the light-absorbing layer in opposition to the upper electrode layer, wherein the upper electrode layer and the lower electrode layer have a reverse bias voltage applied in between to detect electric charges produced by photoelectric conversion in the compound-semiconductor film of chalcopyrite structure.

According to another aspect of the present invention, there is a photodiode comprising a light-absorbing layer composed of a compound-semiconductor film of chalcopyrite structure, a surface layer disposed on the light-absorbing layer, the surface layer having a higher band gap energy than the compound-semiconductor film, a buffer layer disposed on the surface layer, an upper electrode layer disposed on the buffer layer, and a lower electrode layer disposed on a backside of the light-absorbing layer in opposition to the upper electrode layer, wherein the upper electrode layer and the lower electrode layer have a reverse bias voltage applied in between to detect electric charges produced by photoelectric conversion in the compound-semiconductor film of chalcopyrite structure.

According to another aspect of the present invention, there is a method of fabricating a photodiode, the method comprising a first step of holding a substrate temperature at a first temperature, retaining a composition ratio of (Cu/(In+Ga)) to a 0 in a Group-III element excessive state, a second step of holding the substrate temperature within a range from the first temperature to a second temperature higher than the first temperature, shifting the composition ratio of (Cu/(In+Ga)) to a 1.0 or more being a Cu element excessive state, and a third step of shifting the composition ratio of (Cu/(In+Ga)) from the 1.0 or more being the Cu element excessive state to a 1.0 or less being a Group-III element excessive state, wherein the third step comprises holding the substrate temperature for a first period at the second temperature, and holding the substrate temperature for a second period within a range from the second temperature to a third temperature lower than the second temperature, for a low-temperature growth to form a compound-semiconductor film of chalcopyrite structure with a suppressed surface precipitation of Cu.

Advantageous Effects of Invention

The present invention affords to provide a photodiode and a fabrication method thereof, the photodiode being adapted for a favorable characteristic of wavelength sensitivity, with a suppressed Cu precipitation on a surface of as-made CIGS film, allowing for low dark-current and low-voltage operation.

BRIEF DESCRIPTION OF DRAWINGS

FIG. 7A is a time chart showing steps for formation of a compound-semiconductor film of chalcopyrite structure, covering substrate temperatures and elements as ingredients for film formation by the steps, in a method of fabricating a photodiode according to the embodiment.

FIG. 7B is a time chart showing ratios of (Cu/(In+Ga)) in the steps of FIG. 7A.

FIG. 18A is an example of SEC micrograph in section of a photodiode formed with a surface layer according to the embodiment.

FIG. 18B is an explanatory diagram of structure corresponding to FIG. 18A.

FIG. 19 is a graph plotting results of an SIMS analysis of the photodiode according to the embodiment (FIG. 18A).

DESCRIPTION OF EMBODIMENTS

Figure 1A:
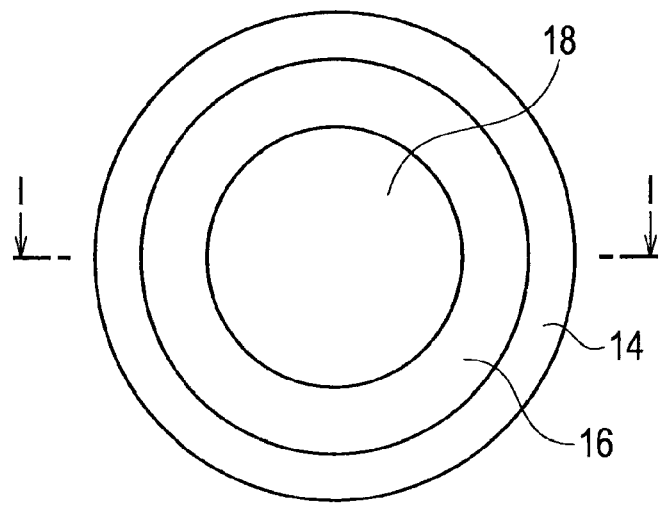
FIG. 1A is a schematic plan view of pattern configuration of a photodiode according to an embodiment of the present invention.

There will be described an embodiment of the present invention with reference to the drawings. In the drawings, identical or similar elements or portions are designated at identical or similar reference numbers. The drawings are schematic with illustrative thickness-to-planer dimension relationships, inter-layer thickness ratios, etc, as they are non-specific. For specific dimensions such as thickness, associated description should be taken into account for determination. Also, dimensional relationships and ratios may be different between drawings.

The above-noted embodiment is illustrative as a device and/or a method to implement a technical concept of the present invention, and not restrictive in material quality, shape, structure, arrangement, etc. The embodiment may well be changed or modified in various manners without departing from the scope of appended claims.

Embodiment

Figure 1B:
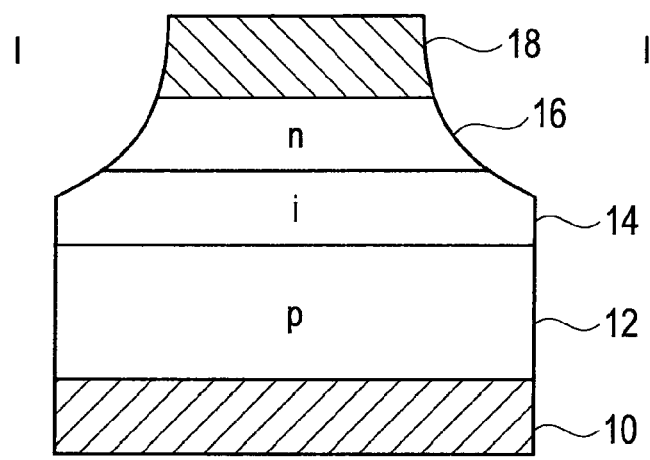
FIG. 1B is a schematic sectional view of structure along line I-I of FIG. 1A.

FIG. 1A shows a schematic plan of a photodiode according to the embodiment, in the form of a pattern configuration, and FIG. 1B, a schematic section of structure along line I-I of FIG. 1A.

Referring to FIG. 1A and FIG. 1B, according to the embodiment, the photodiode includes: a light-absorbing layer 12 composed of a compound-semiconductor film of chalcopyrite structure; a surface layer 14 disposed on the light-absorbing layer 12, the surface layer 14 having a higher band gap energy than the compound-semiconductor film; an upper electrode layer 18 disposed on the surface layer 14; and a lower electrode layer 10 disposed on a backside of the light-absorbing layer 12 in opposition to the upper electrode layer 18. It is configured for the upper electrode layer 18 and the lower electrode layer 10 to have a reverse bias voltage $V_R$ (V) applied in between to detect electric charges produced by photoelectric conversion in the compound-semiconductor film of chalcopyrite structure.

According to the embodiment, the photodiode thus has a reverse bias voltage $V_R$ (V) applied between the upper electrode layer 18 and the lower electrode layer 10, which causes electric charges produced by photoelectric conversion to be multiplied by impact ionization in the light-absorbing layer 12 composed of a compound-semiconductor film of chalcopyrite structure.

The upper electrode layer 18 is formed as a transparent electrode. As a material for the transparent electrode, there may be use of, for instance, a ZnO film, an ITO film, a tin oxide ($SnO_2$) film, or an indium oxide ($In_2O_3$) film.

For the lower electrode layer 10, there may be use of, for instance, molybdenum (Mo), niobium (Nb), tantalum (Ta), tungsten (W), etc.

For the light-absorbing layer 12 of the photodiode shown in FIG. 1B, the compound-semiconductor film of chalcopyrite structure is made of Cu ($In_x$, $Ga_{1-x}$) $Se_2$ ($0 \leq x \leq 1$).

The surface layer 14 can be formed as an i-type CIGS layer, for instance. It is made as a high-resistivity layer with a lower Cu concentration than the light-absorbing layer 12 made of Cu ($In_x$, $Ga_{1-x}$) $Se_2$ ($0 \leq x \leq 1$). That is, the surface layer 14 is formed as a high-resistivity layer by way of low-temperature growth for configuration with a suppressed Cu precipitation on a surface of as-made CIGS film.

There may be a surface layer 14 made of $In_x$, $Ga_{1-x}Se$ ($0 \leq x \leq 1$) completely free of Cu.

The upper electrode layer 18 may be configured with a non-doped ZnO (i-ZnO) film disposed on the surface layer 14, and an n-type ZnO film formed on the non-doped ZnO (i-ZnO) film.

According to the embodiment, there may be a photodiode additionally including a buffer layer 16 disposed on the upper surface layer 14, with the upper electrode layer 18 disposed on the buffer layer 16.

The buffer layer 16 has an opposite conductivity type to the light-absorbing layer 12.

As a material for formation of the buffer layer 16, there may be use of CdS, ZnS, ZnO, ZnMgO, ZnSe, $In_2S_3$, etc.

The upper electrode layer 18 may well be provided as a transparent electrode of a non-doped ZnO (i-ZnO) film, to plug voids or pinholes in a substrate CIGS film with a semi-insulating layer, thus preventing leakage. The non-doped ZnO (i-ZnO) film may then have an increased depth to reduce dark currents at a p-n junction boundary surface.

According to the embodiment, the configuration of photodiode with a buffer layer 16 disposed on the surface layer 14 allows for reduction of leak currents by the buffer layer 16, while the present invention is not restricted thereto. For instance, there may be use of a buffer-less configuration to provide an upper electrode layer 18 on the surface layer 14.

Further, as illustrated in FIG. 1B, there may be a mesa structure in configuration of part of surface layer 14, buffer layer 16, and upper electrode layer 18. Provision of such a mesa structure allows for a secured reverse breakdown voltage nature and a reduced reverse leak current of photodiodes according to the embodiment.

There may be photodiodes configured as a photo sensor with a sensitivity range covering a near-infrared light region, as well, according to the embodiment illustrated in FIGS. 1A and 1B.

According to the embodiment, there may well be photodiodes implemented with: an upper electrode layer 18 approximately 500 nm thick for instance; a buffer layer 16 within a thickness range of approximately 50 nm to 100 nm for instance; a surface layer 14 within a depth range of approximately 200 nm to 600 nm for instance; a light-absorbing layer 12 within a thickness range of approximately 1 μm to 2 μm for instance; a lower electrode layer 10 approximately 600 nm thick for instance; and a total structure approximately 3 μm thick for instance, with the lower electrode layer 10 and the upper electrode layer 18 inclusive.

(Multiplication Mechanism of Photodiode)

Figure 2:
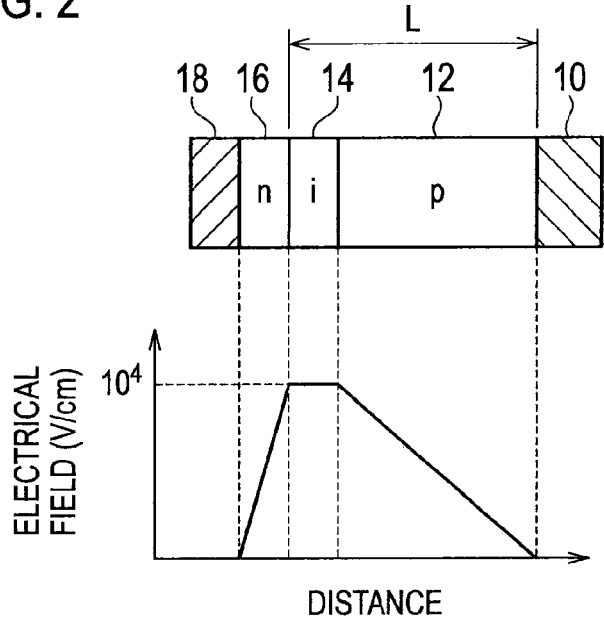
FIG. 2 is a graph representing a relationship between electrical field intensities and depthwise distances for a reverse bias voltage $V_R$ (V) applied between an upper electrode layer and a lower electrode layer of a photodiode according to the embodiment.

FIG. 2 represents a relationship between electrical field intensities and depthwise distances for a reverse bias voltage $V_R$ (V) applied between an upper electrode layer 18 and a lower electrode layer 10 of a photodiode according to the embodiment. With the reverse bias voltage $V_R$ (V) applied between upper electrode layer 18 and lower electrode layer 10, the photodiode had a buffer layer 16 and a light-absorbing layer 12 substantially depleted, and an electric field with intensities as high as approximately $1 \times 10^4$ (V/cm) or near, for instance, applied to a surface layer 14 formed as a high-resistivity layer. The intensity of electric field may have a peak varied within a range of approximately $1 \times 10^4$ to $4 \times 10^5$ (V/cm) or near, for instance, depending on a film depth and a CIGS composition of the light-absorbing layer 12.

In photodiodes according to the embodiment, there were phenomena of Avalanche multiplication developed each with a low voltage within a range of approximately 12 V or near applied as a reverse bias voltage $V_R$ (V) between an upper electrode layer 18 and a lower electrode layer 10.

For typical silicon devices, there are levels of approximately 100 V or near needed to cause an Avalanche multiplication.

Figure 3:
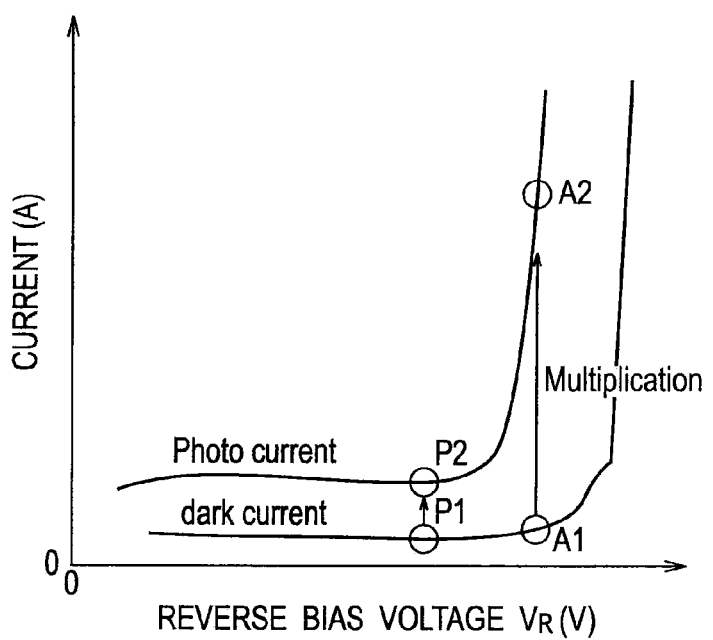
FIG. 3 is a graph of schematic current vs. voltage characteristic curves describing a multiplication between reception and non-reception of light on photodiodes according to the embodiment.

FIG. 3 describes, in a graph of schematic current vs. voltage characteristic curves, a multiplication between reception and non-reception of light on a photodiode according to the embodiment.

As will be apparent from FIG. 3, there were little variations in difference between a region of values P1 of dark current in an irradiation-less phase and a region of values P2 of photo current in an irradiated phase, along with application of reverse bias voltages $V_R$ (V) developing electric fields of relatively low intensities. To the contrary, there were very significant variations in difference between a region of values A1 of dark current in the irradiation-less phase and a region of values A2 of photo current in the irradiated phase, along with application of reverse bias voltages $V_R$ (V) developing electric fields of relatively high intensities to be sufficient to induce an Avalanche multiplication effect. Accordingly, there were apparent improvements including an S/N ratio of the photodiode according to the embodiment.

Figure 4:
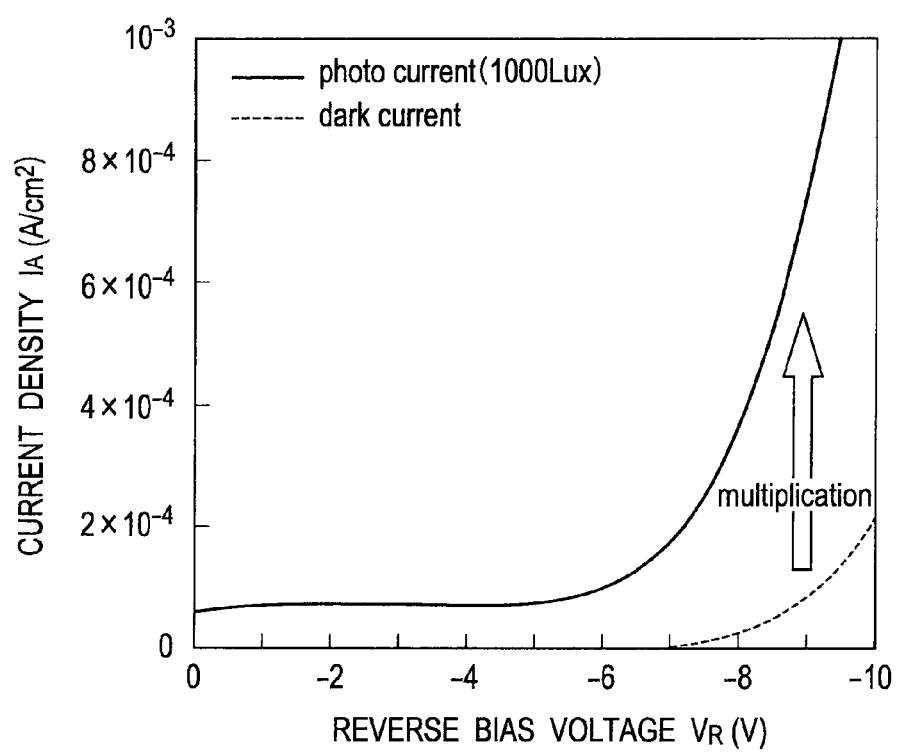
FIG. 4 is a graph of curves each representing a relationship between current densities $I_A$ (A/cm$^2$) and reverse bias voltages $V_R$ (V) applied between an upper electrode layer and a lower electrode layer, as a characteristic of photodiodes according to the embodiment.

FIG. 4 shows, in a graph, those curves representing relationships between current densities $I_A$ ($A/cm^2$) and reverse bias voltages $V_R$ (V) applied between an upper electrode layer 18 and a lower electrode layer 10, as characteristics of a photodiode according to the embodiment. The solid-line curve represents data of measurements of photo current density for a light irradiation of 1,000 Lux, and the dotted-line curve represents data of measurements of dark current density. As will be apparent from measurement data of FIG. 4 also, there were little variations in difference between a region of dark current in an irradiation-less phase and a region of photo current under the light irradiation of 1,000 Lux, along with application of reverse bias voltages $V_R$ (V) developing electric fields of relatively low intensities. To the contrary, there were very significant variations in difference between a region of dark current in the irradiation-less phase and a region of photo current under the light irradiation of 1,000 Lux, along with application of reverse bias voltages $V_R$ (V) developing electric fields of relatively high intensities to be sufficient to induce an Avalanche multiplication effect. According to the embodiment, the photodiode was adapted for a low-voltage operation, which made levels of dark current substantially comparable between the region thereof along with application of reverse bias voltages $V_R$ (V) developing electric fields of relatively low intensities and the region thereof along with application of reverse bias voltages $V_R$ (V) developing electric fields of relatively high intensities to be sufficient to induce an Avalanche multiplication effect. Accordingly, there were observed improvements including an S/N ratio of the photodiode according to the embodiment.

Figure 5:
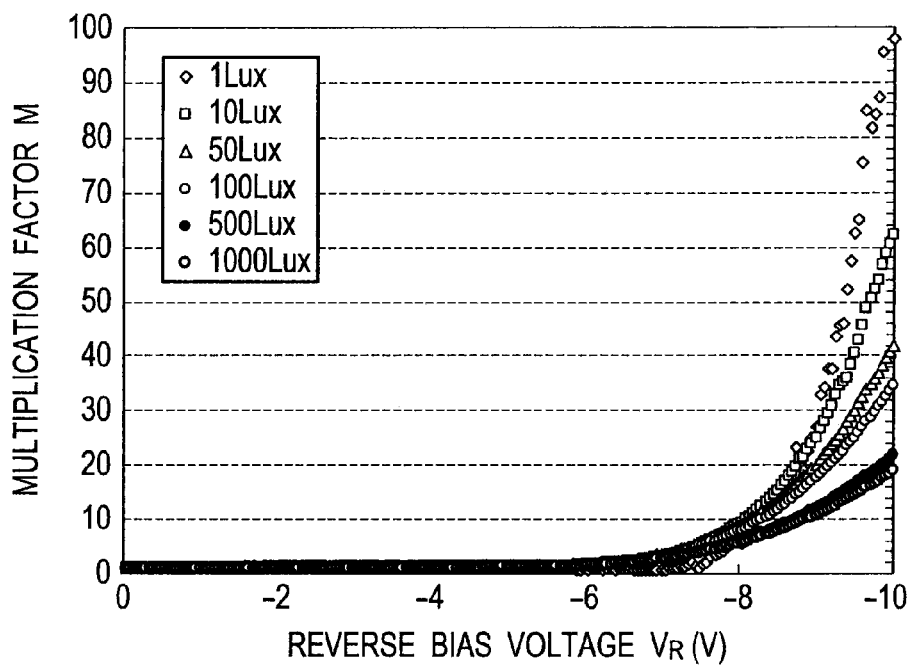
FIG. 5 is a graph plotting relationships between multiplication factors M and reverse bias voltages $V_R$ (V) for parametric illumination intensities of received light, as characteristics of photodiodes according to the embodiment.

FIG. 5 shows, in a graph, plots of relationships between multiplication factors M and reverse bias voltages $V_R$ (V) for parametric illumination intensities of irradiated light, as characteristics of a photodiode according to the embodiment. As will be seen from FIG. 5, according to the embodiment, the photodiode was adapted to operate with reverse bias voltages $V_R$ (V) as relatively low as 0 V to −10 V. It will also be understood that the lower the illumination intensity the higher the multiplication factor M. For instance, at a reverse bias voltage $V_R$ (V)=−10 V, there were multiplication factors of 100 to 20 or near obtained under illumination intensities within a range of 1 Lux to 1,000 Lux.

(Process of Forming a Compound-Semiconductor Film of Chalcopyrite Structure)

In this embodiment, photodiodes are configured with a compound-semiconductor film of chalcopyrite structure adapted to work as a light-absorbing layer 12 thereof, which may well be formed on, among others, a semiconductor substrate or a glass substrate by way of: a PVD (Physical Vapor Deposition) method, such as by a vacuum evaporation or by a sputtering; or an MBE (Molecular Beam Expitaxy) method. Here, the PVD method collectively refers to a set of applicable methods including a method of depositing a vacuum-vaporized raw material to make a film.

For use of the vacuum evaporation method, there may be a set of vacuum evaporation sources adapted for individual evaporation of compound components (Cu, In, Ga, Se, S) on a substrate.

For the sputtering method, there may be use of a chalcopyrite compound as a target, or use of components thereof as individual targets.

For formation of compound-semiconductor films of a chalcopyrite structure on a glass substrate, the substrate may be heated to high temperatures causing composition changes due to defection of a chalcogenide element. In such a case, as-made films may well be heat-treated in a Se or S vapor atmosphere at temperatures of 400 to 600 degrees C. for a period within a range of one to several hours (for a selenidation or sulfurization process) to supplement Se or S.

(Fabrication Method)

Description is now made of a process for formation of a compound-semiconductor film of chalcopyrite structure, with reference to FIG. 7A and FIG. 7B, in course of a fabrication of photodiodes according to the embodiment, of which an example of configuration will be discussed later on with reference to FIG. 6A, FIG. 63, and FIG. 8 et seq. FIG. 7A shows steps of that process, covering substrate temperatures and elements as ingredients by the steps, and FIG. 7B shows composition ratios of (Cu/(In+Ga)) in the steps.

According to the embodiment, the fabrication of photodiodes is implemented as a photodiode fabrication method including a film formation process three-stepped as illustrated in FIG. 7A and FIG. 7B for formation of a compound-semiconductor film of chalcopyrite structure.

The film formation process is divided into three steps being a first step, a second step, and a third step as illustrated in FIG. 7A and FIG. 73 as an example for formation of a p-type CIGS film composition-controlled to be Cu (In$_x$, Ga$_{1-x}$) Se$_2$ (0≦x≦1). In this regard, FIG. 7A shows substrate temperatures and component elements to be vacuum-evaporated for formation of the film. There may be use of a sputtering method for the film formation. FIG. 7B shows ratios of (Cu/Group-III (In+Ga)).

As illustrated in FIG. 7A and FIG. 7B, according to the embodiment, the photodiode fabrication method includes: a first step (corresponding to a first interval of time designated by a section 1a) of holding a substrate temperature at a first temperature T1, retaining a composition ratio of (Cu/(In+Ga)) to a 0 in a Group-III element excessive state; a second step (corresponding to a second interval of time designated by a section 1b) of holding the substrate temperature within a range from the first temperature T1 to a second temperature T2 higher than the first temperature T1, shifting the composition ratio of (Cu/(In+Ga)) to a 1.0 or more being a Cu element excessive state; and a third step (corresponding to a third interval of time designated by combination of a section 3a and a section 3b) of shifting the composition ratio of (Cu/(In+Ga)) from the 1.0 or more being the Cu element excessive state to a 1.0 or less being a Group-III element excessive state, wherein the third step (corresponding to the third interval of time) is composed of holding the substrate temperature for a first period (as the section 3a) at the second temperature T2, and holding the substrate temperature for a second period (as the section 3b) within a range from the second temperature T2 to a third temperature T3 lower than the second temperature T2, for a low-temperature growth to form a compound-semiconductor film of chalcopyrite structure with a suppressed surface precipitation of Cu.

The third step has the sub-step of holding the substrate temperature for the second period (as the section 3b) within the range from the second temperature T2 to the third temperature T3 lower than the second temperature T2, which allows for a low-temperature growth to form a high-resistivity surface layer 14 with a suppressed Cu precipitation on a surface of the compound-semiconductor film.

The compound-semiconductor film of chalcopyrite structure may well be made of Cu (In$_x$, Ga$_{1-x}$) Se$_2$ (0≦x≦1).

The third temperature may well coincide within a range of 300 degrees C. or more and 400 degrees C. or less.

The second temperature may well be 550 degrees C. or less.

The third step may well have a ratio of (Cu/(In+Ga)) within a range of 0.5 to 1.3 at an end of the first period (as the section 3a), and a ratio of (Cu/(In+Ga)) of 1.0 or less at an end of the second period (as the section 3b).

According to the embodiment, the photodiode fabrication method includes the third step divided into two sub-steps being: the section 3a for a high-temperature processing at the substrate temperature T2; and the section 3b for a shift to a low-temperature processing at the substrate temperature T3, for positive formation of the surface layer 14 to be made as an i-type CIGS layer on a surface of the compound-semiconductor film. The substrate temperature T3 should preferably be within a range of 300 to 400 degrees C., and specifically, approximately 300 degrees C., for instance.

According to the embodiment, the photodiode fabrication method has film-constituent elements vacuum-evaporated not simultaneously, but through the three steps, thus permitting the intra-film distribution of constituent elements to be controlled to some extent. There is flux of beam of In as well as Ga used for a band gap control of the compound-semiconductor film. There may be use of a ratio of (Cu/Group-III (In+Ga)) for control of Cu concentration in a CIGS film. There are resultant merits including a facilitated setting of (Cu/Group-III (In+Ga)) ratio, an easy film depth control, and a secured constant supply of Se.

The facilitated setting of (Cu/Group-III (In+Ga)) ratio permits the ratio of (Cu/Group-III (In+Ga)) to be reduced in the third step to form a surface layer 14 of an i-type CIGS on a surface of compound-semiconductor film, with an enhanced film depth controllability, in a facilitated manner. Such the i-type CIGS surface layer 14 appears working as an i-layer with a decreased carrier number due to a low concentration of Cu controlling intra-film carrier concentrations.

It is noted that the photodiode fabrication method described has been addressed to a low-temperature processing in the section 3b illustrated in FIGS. 7A and 7B, while the present invention is not restricted thereto. For instance, the process may be once interrupted past a third step 3a, for a pause followed by a consecutive temperature shift to such a temperature as shown at the section 3b in FIG. 7A, accompanied by a decreasing Cu proportion to Group-III elements, to form a desirable CIGS surface layer. Further, the present invention is not restricted to the three-stepped method described. For instance, there may be use of a bi-layer method to implement the invention. The bi-layer method is a method of forming a CIGS layer such as by a vacuum deposition or a sputtering, including a first step of using four elements being Cu, In, Ga, and Se, and a consecutive second step of using three elements being In, Ga, and Se, excluding Cu. There may be a film formed by the bi-layer method, and followed by a consecutive temperature shift to such a temperature as shown at the section 3b in FIG. 7A, accompanied by a decreasing Cu proportion to Group-III elements, to form a desirable CIGS surface layer. The present invention may be implemented by use of any other film formation method available (e.g. a sulfurization method, a selenidation-sulfurization method, a simultaneous vacuum deposition method, an in-line simultaneous vacuum deposition method, a fast solid-phase selenidation method, an RR (roll-to-roll) method, an ionized deposition RR method, a simultaneous vacuum deposition RR method, an electro-deposition method, a hybrid process, a hybrid sputtering RR method, a nanoparticle printing method, a nanoparticle printing RR method, or the FASST® process) for formation of a CIGS film followed by such a low-temperature film-forming step as described.

According to the embodiment, the photodiode fabrication method may have a three-stepped process including a third step of decreasing a (Cu/Group-III (In+Ga)) ratio to form a surface layer 14 of an i-type CIGS on a surface of compound-semiconductor film, with an enhanced film depth controllability, in a facilitated manner, permitting the i-type CIGS surface layer 14 to be formed thinner with ease.

Figures 6A, 6B:
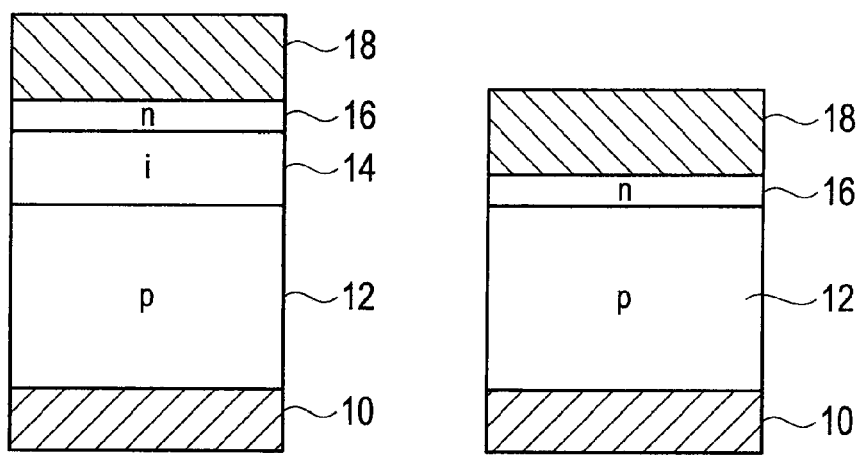
FIG. 6A is a schematic sectional view of structure of a photodiode according to the embodiment.
FIG. 6B is a schematic sectional view of structure of a photodiode as a comparative example.

FIG. 6A shows in schematic section a structure of a photodiode according to the embodiment, and FIG. 6B shows in schematic section a structure of a photodiode as a comparative example. The comparative example shown in FIG. 6B is configured for use as a solar cell.

In FIG. 6B, the comparative example has a layer configuration made of ZnO (designated by reference number 18)/Cds (designated by reference number 16)/CIGS (designated by reference number 12)/Mo (designated by reference number 10). On the other hand, in FIG. 6A, the photodiode according to the embodiment has a layer configuration made of ZnO (designated by reference number 18)/Cds (designated by reference number 16)/InGaSe (designated by reference number 14)/CIGS (designated by reference number 12)/Mo (designated by reference number 10).

Figure 8:
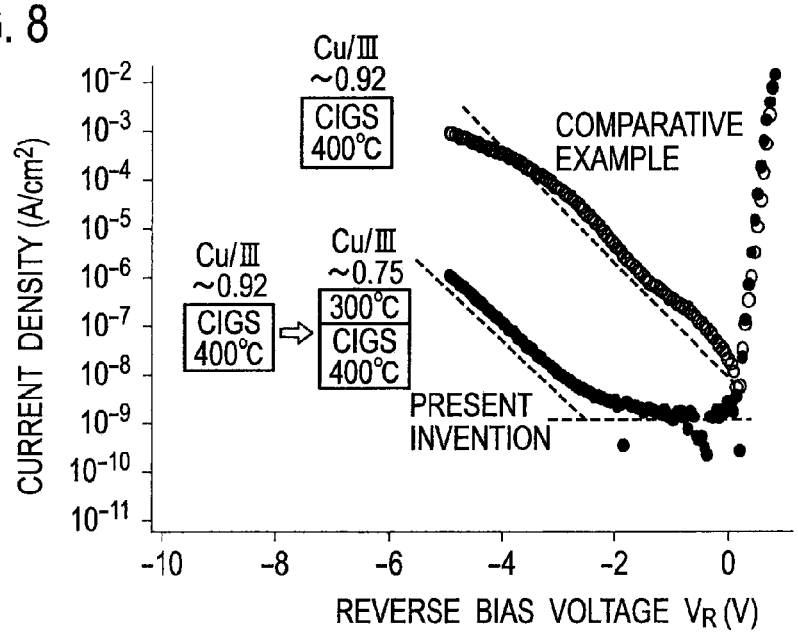
FIG. 8 is a graph plotting relationships between current densities (A/cm$^2$) and reverse bias voltages $V_R$ (V), as a combination of characteristics of the photodiode according to the embodiment (FIG. 6A) and characteristics of the photodiode as a comparative example (FIG. 6B).

FIG. 8 shows, in a graph, plots of relationships between current densities (A/cm$^2$) and reverse bias voltages $V_R$ (V), as a combination of characteristics of the photodiode according to the embodiment (FIG. 6A) and characteristics of the photodiode as a comparative example (FIG. 6B). According to the embodiment, the photodiode in FIG. 6A had a surface layer 14 made as a high-resistivity, high-energy band gap layer by a compound-semiconductor film formed with a reduced (Cu/Group-III (In+Ga)) ratio, with a resultant effect enabling an enhancement of current density (A/cm$^2$) as much as approximately four figures under application of a reverse bias voltage $V_R$ (V).

Figure 9:
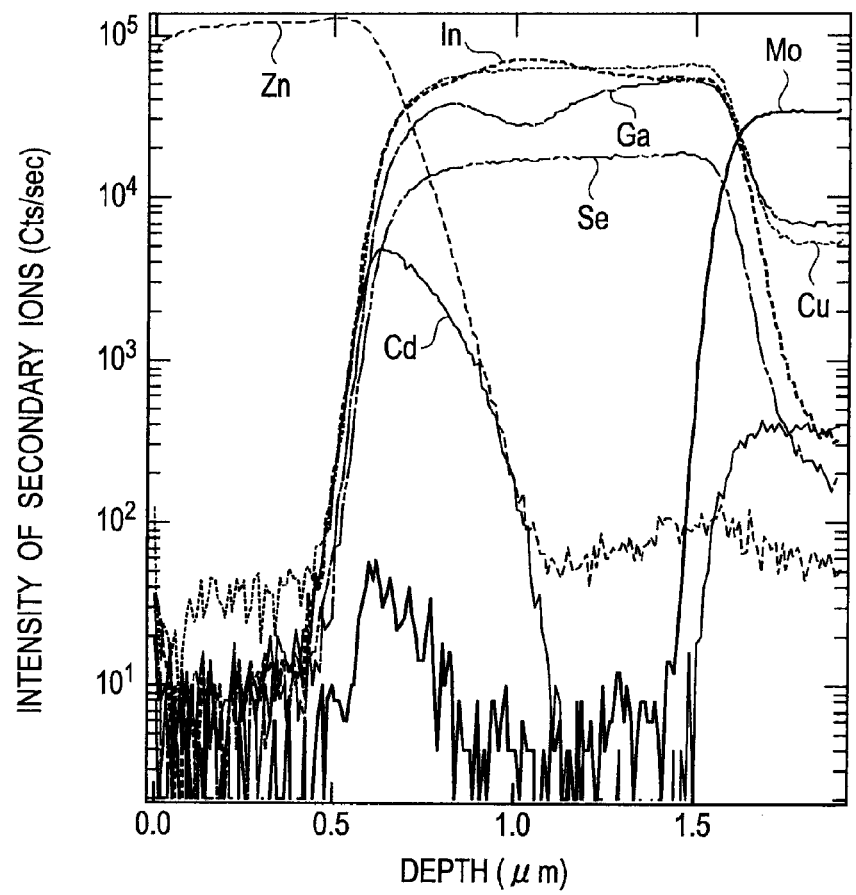
FIG. 9 is a graph plotting results of an SIMS analysis of the photodiode as a comparative example (FIG. 6B).
Figure 10:
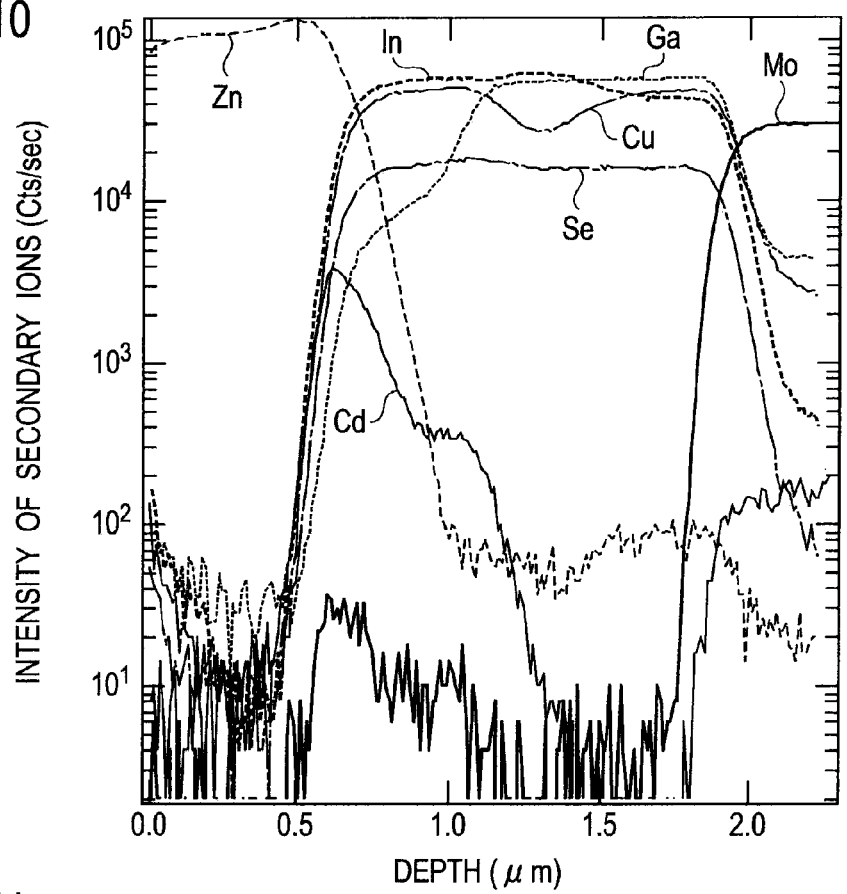
FIG. 10 is a graph plotting results of an SIMS analysis of the photodiode according to the embodiment (FIG. 6A).

FIG. 9 shows, in a graph, plots of data of an SIMS analysis of the photodiode as a comparative example (FIG. 6B), and FIG. 10 shows, in a graph, plots of data of an SIMS analysis of the photodiode according to the embodiment (FIG. 6A).

For the photodiode as a comparative example, there was a compound-semiconductor film formed with a history of substrate temperatures of approximately 550 degrees C. or near in both second and third steps, accompanied by a (Cu/Group-III) ratio of approximately 0.75. Plots of SIMS analysis data in FIG. 9 showed no reduction of surface Cu concentration observed on the compound-semiconductor film. In other words, the compound-semiconductor film was not undoped at the surface.

In this regard, as shown in FIG. 10, the photodiode according to the embodiment had Cu concentrations observed with decreasing tendencies within a depth range of approximately 0.5 to 1.0 μm.

For the photodiode according to the embodiment, the compound-semiconductor film was formed with a history of substrate temperatures of approximately 400 degrees C. or near in both the second step and the first period 3a of the third step, and those of approximately 300 degrees C. or near in the second period 3b of the third step, accompanied by a (Cu/Group-III) ratio of 0.75, to have Cu concentrations observed with significant decreasing tendencies at a surface region of the compound-semiconductor film. The compound-semiconductor film thus had an undoped surface layer 14 formed as an i-type CIGS layer. It is noted that the second step had substrate temperatures of approximately 400 degrees C. or near, accompanied by a (Cu/Group-III) ratio of 0.92, and the second period 3b of the third step had substrate temperatures of approximately 300 degrees C. or near, accompanied by the (Cu/Group-III) ratio of 0.75. As will be seen from FIG. 10, the undoped surface layer 14 (as an i-type CIGS layer) of the compound-semiconductor film had depths of approximately 300 nm or near.

Figure 11:
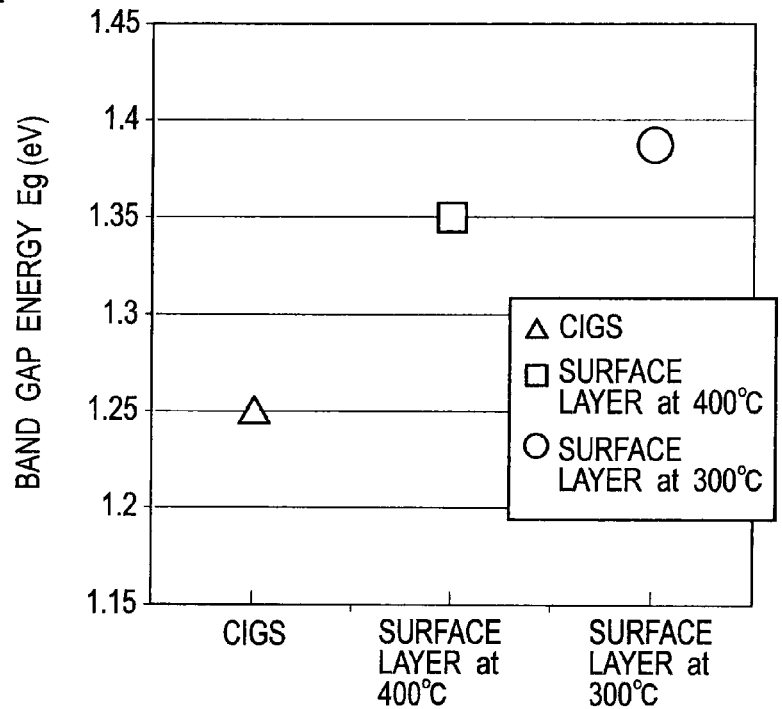
FIG. 11 is a graph plotting band gap energies Eg (eV) with an increasing tendency to a decreasing concentration of Cu in surface layer, as a characteristic of photodiodes according to the embodiment.

FIG. 11 shows, in a graph, plots of band gap energies Eg (eV) with an increasing tendency to a decreasing concentration of Cu, as a characteristic of surface layers of photodiodes according to the embodiment. The photodiodes were each configured with: a light-absorbing layer 12 formed with a CIGS layer, which had a band gap energy Eg of approximately 1.25 eV; and a surface layer 14 formed on the light-absorbing layer 12, with a history of substrate temperatures including a third temperature T3 (cf. FIG. 7A), which was varied. For a temperature T3 of approximately 400 degrees C., the surface layer 14 had a band gap energy raised to approximately 1.35 eV. Still more, for a temperature T3 of approximately 300 degrees C., the surface layer 14 had a band gap energy raised to approximately 1.39 eV. There were band gap energies Eg observed with a tendency to increase with a decrease in Cu concentration of the surface layer 14.

Figure 12A:
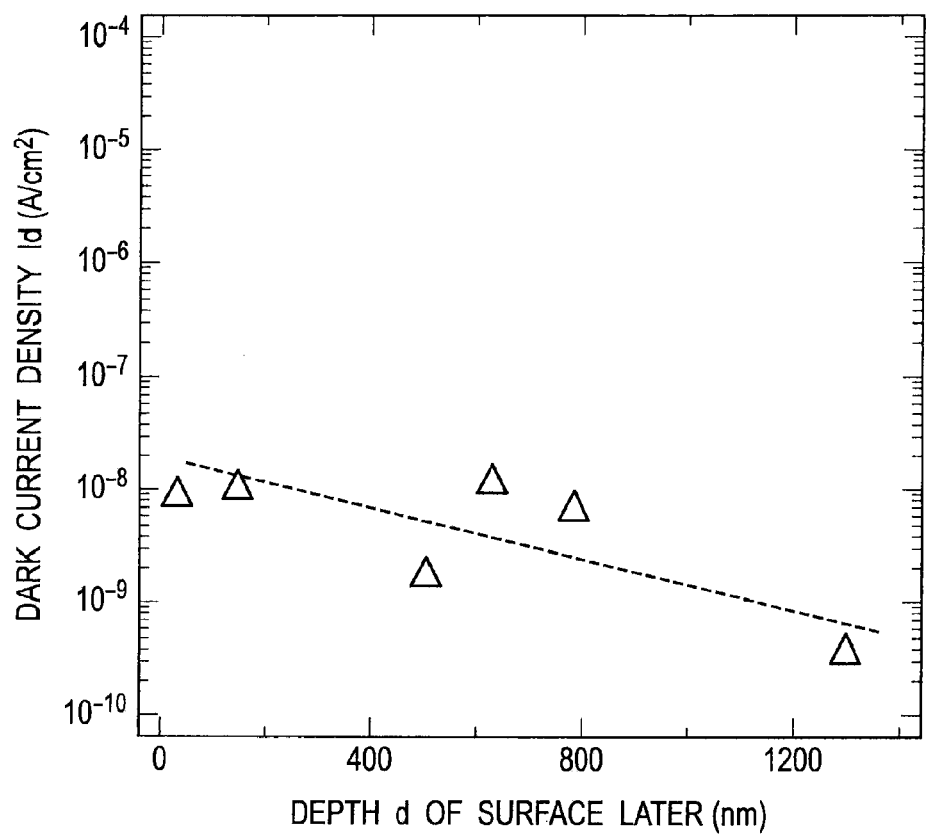
FIG. 12A is a graph plotting a relationship between dark current densities $I_d$ (A/cm$^2$) and surface layer depths d, as a characteristic of photodiodes according to the embodiment.
Figure 12B:
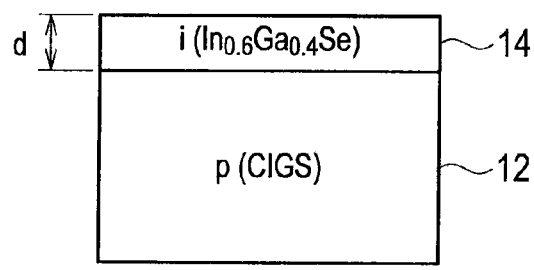
FIG. 12B is a schematic sectional view of a structure of photodiodes according to the embodiment.

FIG. 12A shows, in a graph, plots of a relationship between dark current densities $I_d$ (A/cm$^2$) and surface layer depths d, as a characteristic of photodiodes according to the embodiment. FIG. 12B shows in schematic section a structure including a light-absorbing layer 12 and a surface layer 14 of photodiodes having the characteristic shown in FIG. 12A.

The light-absorbing layer 12 had a CIGS layer formed by a growth temperature of 400 degrees C. with a composition ratio of Ga/(Ga+In) of 0.4. The surface layer 14 had an In$_{0.6}$Ga$_{0.4}$Se layer formed by a growth temperature of 300 degrees C. with a composition ratio of Ga/(Ga+In) of 0.4. There were dark current densities $I_d$ (A/cm$^2$) observed with a tendency to gradually decrease with an increasing depth d, as the depth of surface layer 14 was varied from 0 to 1,300 nm or near. For instance, there was a dark current density $I_d$ (A/cm$^2$) of approximately $3 \times 10^{-10}$ (A/cm$^2$) observed with a depth of approximately 1,300 nm.

Figure 13:
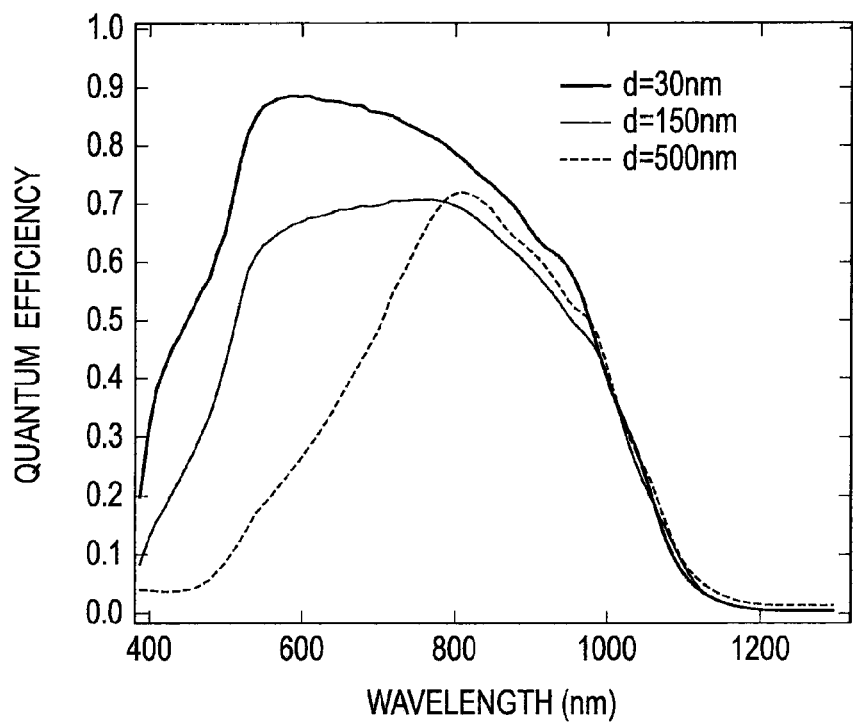
FIG. 13 is a graph of quantum efficiency vs. wavelength characteristics for parametric surface layer depths d of photodiodes according to the embodiment.

FIG. 13 shows, in a graph, quantum efficiency vs. wavelength characteristics for parametric surface layer depths d of photodiodes according to the embodiment. The photodiodes were each configured with: a light-absorbing layer 12 including a CIGS layer formed by a growth temperature of 400 degrees C. with a composition ratio of Ga/(Ga+In)=0.4; and a surface layer 14 including an $In_{0.6}Ga_{0.4}Se$ layer formed by a growth temperature of 300 degrees C with a composition ratio of Ga/(Ga+In)=0.4. As shown in FIG. 13, there were quantum efficiencies observed over a wide wavelength range with a tendency to increase as the surface layer 14 had a reduced depth d. The thinner the depth d of surface layer 14, the smaller the light absorption of surface layer 14 on the shorter wavelength side, and the higher the quantum efficiency, as an observed tendency.

(Photoelectric Conversion Characteristic)

Figure 14:
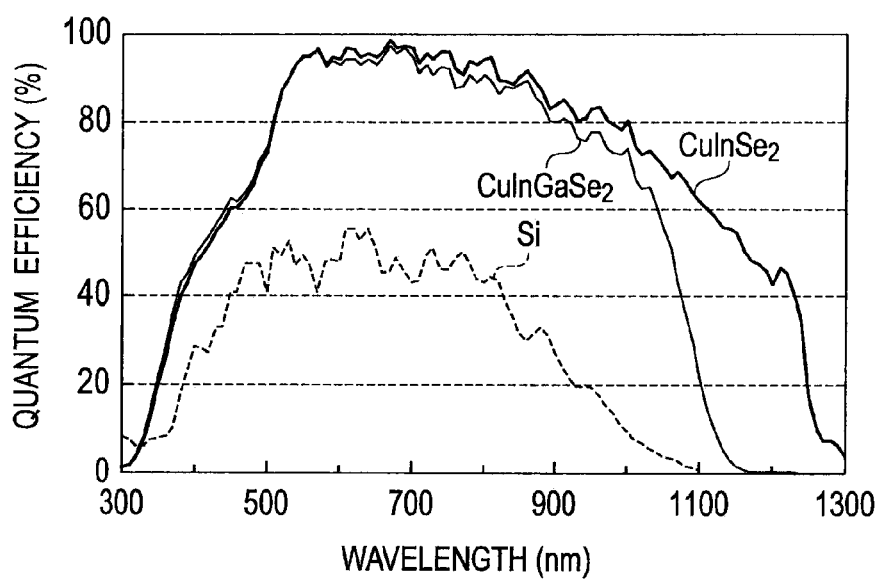
FIG. 14 is a graph of quantum efficiency vs. wavelength characteristics of photodiodes according to the embodiment.

FIG. 14 shows, in a graph, quantum efficiency vs. wavelength characteristics of photodiodes according to the embodiment. The photodiodes were each configured with a light-absorbing layer 12 made of a compound-semiconductor film of chalcopyrite structure (Cu $(In_x, Ga_{1-x})$ $Se_2$ ($0 \leq x \leq 1$)) working as a layer to absorb light, exhibiting, as reflection of its quantum efficiency, photoelectric conversion characteristics with high quantum efficiencies over a wide wavelength band encompassing from visible wavelengths to near-infrared wavelengths. Quantum efficiencies were doubled relative to silicon (Si)-based photoelectric conversion characteristics. The compound-semiconductor film of chalcopyrite structure, working as a light-absorbing layer 12, may have its composition (Cu $(In_x, Ga_{1-x})$ $Se_2$ ($0 \leq x \leq 1$)) changed between Cu(InGa)$Se_2$ and Cu(In)$Se_2$ to extend the wavelength band up to near-infrared wavelengths approximately 1,300 nm.

(Light Absorption Characteristic)

Figure 15:
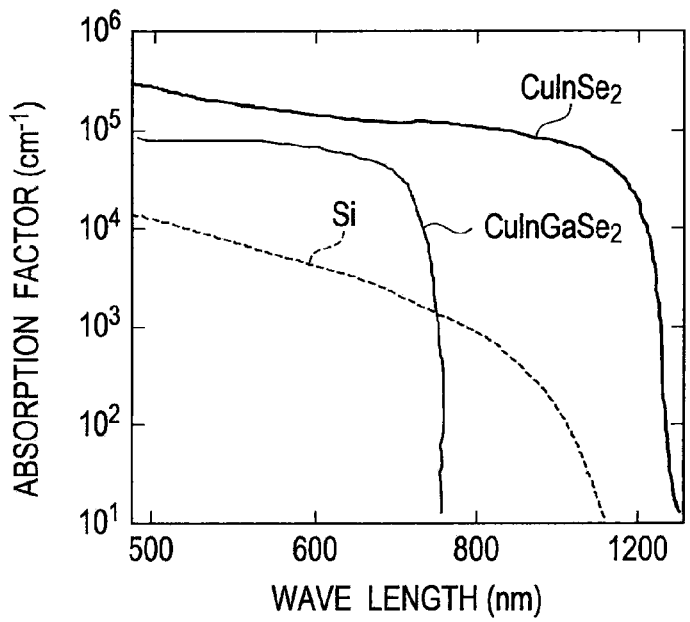
FIG. 15 is a graph of light absorption characteristics of photodiodes according to the embodiment.

FIG. 15 shows, in a graph, light absorption characteristics of photodiodes according to the embodiment. The photodiodes were each configured with a compound-semiconductor film of chalcopyrite structure (Cu $(In_x, Ga_{1-x})$ $Se_2$ ($0 \leq x \leq 1$)) working as a light-absorbing layer 12, exhibiting, as reflection of its light absorption coefficient, a robust light absorption characteristic over a wide wavelength band encompassing from visible wavelengths to near-infrared wavelengths.

For instance, it had a silicon (Si)-based absorption coefficient times approximately 100 even in a visible wavelength region. The compound-semiconductor film of chalcopyrite structure, working as a light-absorbing layer 12, may have its composition (Cu$(In_x, Ga_{1-x})$ $Se_2$ ($0 \leq x \leq 1$)) changed between Cu(InGa)$Se_2$ and Cu(In)$Se_2$ to extend the absorption characteristic up to wavelengths approximately 1,300 nm or near.

(Characteristics on Band Gap Energy and In/(In+Ga) Composition Ratio)

Figure 16:
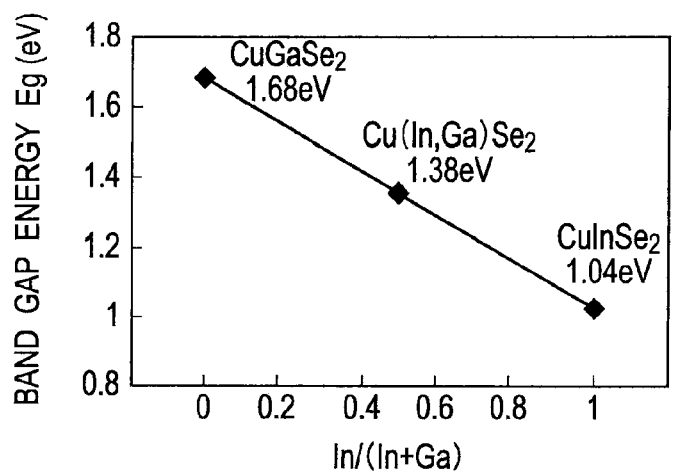
FIG. 16 is a graph plotting a relationship between band gap energies Eg (eV) and composition ratios of In/(In+Ga) in compound-semiconductor films of chalcopyrite structure of photodiodes according to the embodiment

FIG. 16 shows, in a graph, plots of a relationship between band gap energies Eg (eV) and composition ratios of In/(In+Ga) in compound-semiconductor films of chalcopyrite structure (Cu$(In_x, Ga_{1-x})$ $Se_2$ ($0 \leq x \leq 1$)) of photodiodes according to the embodiment.

As will be seen from FIG. 16, the photodiodes had: a film of Cu (Ga)$Se_2$ with a band gap energy of 1.68 eV; a film of Cu (In, Ga)$Se_2$ with a band gap energy of 1.38 eV; and a film of Cu (In)$Se_2$ with a band gap energy of 1.04 eV, respectively.

Compound-semiconductor films of chalcopyrite structure (Cu$(In_x, Ga_{1-x})$ $Se_2$ ($0 \leq x \leq 1$)) have their In/(In+Ga) composition ratios, which are controllable to change their band gap energies as shown in FIG. 16, so their photo-electric conversion wavelengths are variable by composition ratio control. For instance, there may be a compound-semiconductor film rendered Ga-excessive at an upside of a CIGS film therein, as well as near a downside thereof, to provide an increased band gap energy for reduction of dark current. Also, there may be a compound-semiconductor film rendered In-excessive at a prescribed depth inside a CIGS film thereof, to provide a decreased band gap energy for enhancement of a photo-electric conversion efficiency at a near-infrared wavelength region.

Further, in formation of a CIGS surface layer discussed with reference to FIGS. 7A and 73, there may be a Ga content increased in combination with a (Cu/Group-III) ratio kept contestant during the surface layer formation, to provide an increased band gap energy on the obverse side, with an enhanced quantum efficiency at the shorter wavelength side.

Figure 17:
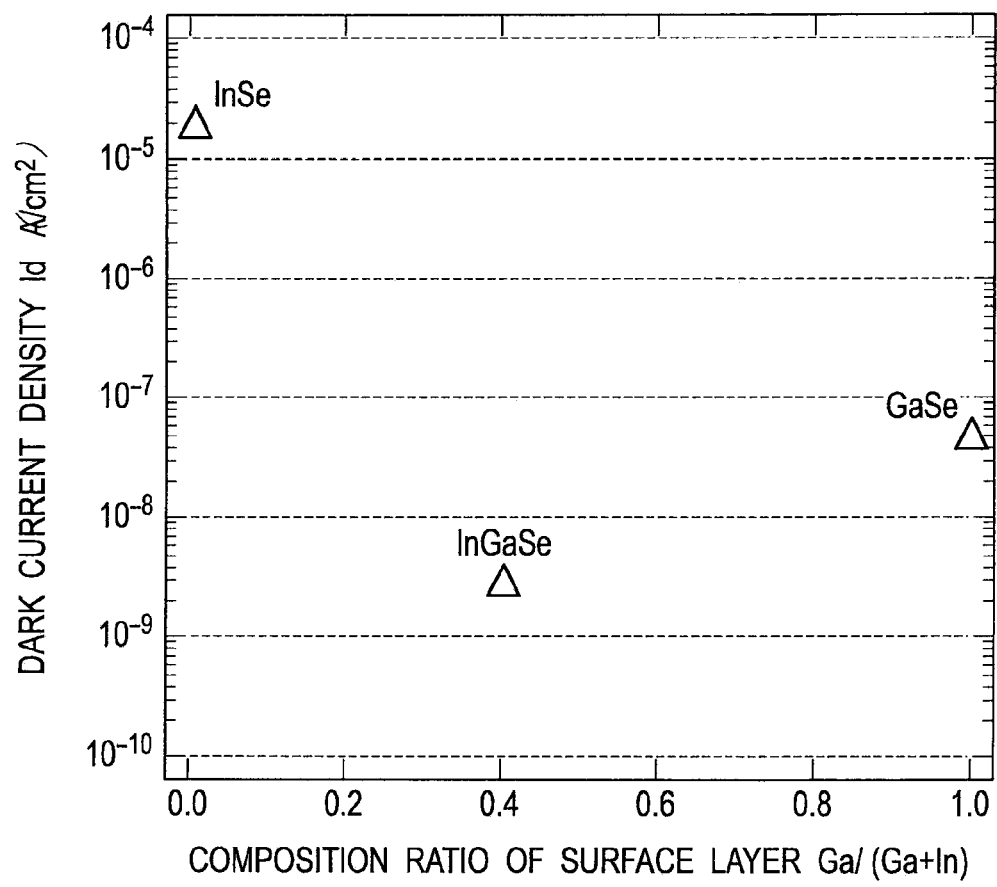
FIG. 17 is a graph plotting a relationship between dark current densities $I_d$ (A/cm$^2$) and composition ratios of Ga/(Ga+In) of surface layer in photodiodes according to the embodiment

FIG. 17 shows, in a graph, plots of a relationship between dark current densities $I_d$ (A/cm$^2$) and composition ratios of Ga/(Ga+In) of surface layer 14 in photodiodes according to the embodiment. For instance, there was a photodiode formed with a surface layer 14 of a Ga/(Ga+In) composition ratio of approximately 0.4, which had a dark current density Id of approximately $3 \times 10^{-3}$ (A/cm$^2$).

Figure 20:
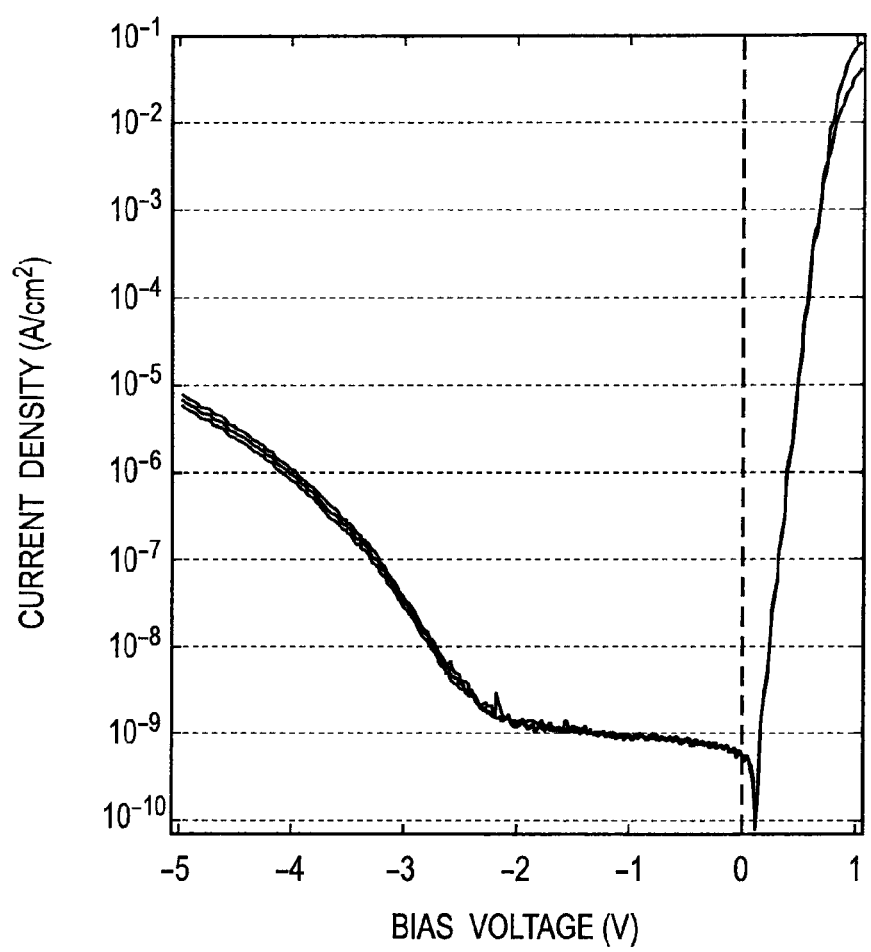
FIG. 20 is a graph plotting relationships between forward and reverse current densities (A/cm$^2$) and bias voltages V (V), as characteristics of the photodiode according to the embodiment (FIG. 18A).

FIG. 18A shows an example of SEM micrograph in section of a photodiode formed with a surface layer 14 according to the embodiment, and FIG. 18B shows an explanatory diagram of structure corresponding to FIG. 18A. FIG. 19 shows, in a graph, plots of data of an SIMS analysis of the photodiode according to the embodiment (FIG. 18A). As will be seen from FIG. 9, there were Cu concentrations observed as steeply decreasing within a depth range of 0 to 0.2 µm, where the surface layer 14 appears to have had decreased Cu concentrations. FIG. 20 shows, in a graph, plots of relationships between forward and reverse current densities (A/cm$^2$) and bias voltages V (V), as characteristics of the photodiode according to the embodiment (FIG. 18A). There were dark current densities of $10^{-10}$ to $10^{-6}$ (A/cm$^2$) appearing at reverse bias voltages within a range of 0 to 5 V.

The embodiment described affords a photodiode and a fabrication method thereof, the photodiode being configured to have high-intensity electric fields applied to a light-absorbing layer including a semiconductor of chalcopyrite structure, thereby developing a multiplication of electric charges by impact ionization, with an enhanced dark current characteristic, allowing for a great enhanced efficiency of detection even under low irradiation intensities, and an enhanced S/N ratio.

The embodiment described affords a photodiode and a fabrication method thereof, the photodiode being adapted for a low-temperature growth to suppress Cu precipitation on a surface of as-made CIGS film, to implement an enhanced dark current characteristic, thereby permitting observation of a multiplication that otherwise would not be caused, allowing for detection even under low irradiation intensities.

The embodiment described provides a photodiode and a fabrication method thereof, the photodiode being adapted for a favorable characteristic of wavelength sensitivity with suppressed Cu precipitation on a surface of as-made CIGS film, allowing for low dark-current and low-voltage operation.

Other Embodiments

While the present invention has been described by a mode of embodiment, it will be construed that the disclosure is not restrictive thereto even in any discussion or depiction therein. Artisan may associate the disclosure or part thereof with various alternative embodiment modes, examples, or techniques for application with ease.

According to the embodiment, there are photodiodes as well as fabrication methods thereof each employing Cu $(In_x, Ga_{1-x})$ $Se_2$ ($0 \leq x \leq 1$) as a compound-semiconductor film of chalcopyrite structure in a light-absorbing layer. This is not restrictive to the present invention, either.

There are Cu $(In_x, Ga_{1-x})$ $(Se_y, S_{1-y})$ ($0 \leq x \leq 1$; $0 \leq y \leq 1$) known each as a composition of CIGS film applicable to a compound-semiconductor film. CIGS films of such compositions also are employable.

There are other compound-semiconductor films of chalcopyrite structure, such as $CuAlS_2$, $CuAlSe_2$, $CuAlTe_2$, $CuGaS_2$, $CuGaSe_2$, $CuGaTe_2$, $CuInS_2$, $CuInSe_2$, $CuInTe_2$, AgAlS₂, AgAlSe₂, AgAlTe₂, AgGaS₂, AgGaSe₂, AgGaTe₂, AgInS₂, AgInSe₂, and AgInTe₂, which also are each applicable.

The embodiment described includes an example of configuration with a buffer layer provided on a compound-semiconductor film (as a CIGS film), and an example of buffer-less configuration with an electrode layer provided on a compound-semiconductor film (as a CIGS film), while the present invention is not limited thereto.

Such, being the case, the present invention covers a variety of embodiment examples, beyond described ones. For the present invention, the technical matters are defined by characteristic features of appended claims to be construed in view of description.

INDUSTRIAL APPLICABILITY

The present invention provides a photodiode with enhanced sensitivities even in a region of near-infrared wavelengths, thus having applications over a wide wavelength range, such as those to photo detectors, and Avalanche diodes.

REFERENCE SIGNS LIST

10 . . . lower electrode layer
12 . . . light-absorbing layer
14 . . . surface layer (high-intensity bang gap layer)
16 . . . buffer layer
18 . . . upper electrode layer

The invention claimed is:

1. A photodiode comprising:
   a light-absorbing layer composed of a compound-semiconductor film of chalcopyrite structure, the compound-semiconductor film of chalcopyrite structure being made of Cu (Inx, Ga1-x) Se2 ($0 \leq x \leq 1$);
   a surface layer disposed on the light-absorbing layer, the surface layer having a higher band gap energy than the compound-semiconductor film;
   an upper electrode layer disposed on the surface layer; and
   a lower electrode layer disposed on a backside of the light-absorbing layer in opposition to the upper electrode layer, wherein
   the upper electrode layer and the lower electrode layer have a reverse bias voltage applied in between to detect electric charges produced by photoelectric conversion in the compound-semiconductor film of chalcopyrite structure,
   wherein the surface layer has a lower Cu concentration than the compound-semiconductor film made of Cu (Inx, Ga1-x) Se2 ($0 \leq x \leq 1$), and a particle size of the surface layer is smaller than that of the compound-semiconductor film of chalcopyrite structure.

2. The photodiode according to claim 1, wherein the photodiode is configured to have electric charges due to photoelectric conversion multiplied by impact ionization in the compound-semiconductor film of chalcopyrite structure.

3. The photodiode according to claim 1, wherein the upper electrode layer is formed as a transparent electrode.

4. The photodiode according to claim 1, wherein the surface layer is made of $In_x, Ga_{1-x}Se$ ($0 \leq x \leq 1$).

5. The photodiode according to claim 1, wherein the upper electrode layer comprises:
   a non-doped ZnO film provided on the compound-semiconductor film; and
   an n-type ZnO film provided on the non-doped ZnO film.

6. A photodiode comprising:
   a light-absorbing layer composed of a compound-semiconductor film of chalcopyrite structure, the compound-semiconductor film of chalcopyrite structure being made of Cu (Inx, Ga1-x) Se2 ($0 \leq x \leq 1$);
   a surface layer disposed on the light-absorbing layer, the surface layer having a higher band gap energy than the compound-semiconductor film;
   a buffer layer disposed on the surface layer;
   an upper electrode layer disposed on the buffer layer; and
   a lower electrode layer disposed on a backside of the light-absorbing layer in opposition to the upper electrode layer, wherein
   the upper electrode layer and the lower electrode layer have a reverse bias voltage applied in between to detect electric charges produced by photoelectric conversion in the compound-semiconductor film of chalcopyrite structure,
   wherein the surface layer has a lower Cu concentration than the compound-semiconductor film made of Cu (Inx, Ga1-x) Se2 ($0 \leq x \leq 1$), and a particle size of the surface layer is smaller than that of the compound-semiconductor film of chalcopyrite structure.

7. The photodiode according to claim 6, wherein the photodiode is configured to have electric charges due to photoelectric conversion multiplied by impact ionization in the compound-semiconductor film of chalcopyrite structure.

8. The photodiode according to claim 6, wherein the upper electrode layer is formed as a transparent electrode.

9. The photodiode according to claim 6, wherein the surface layer is made of $In_x, Ga_{1-x}Se$ ($0 \leq x \leq 1$).

10. The photodiode according to claim 6, wherein the upper electrode layer comprises:
    a non-doped ZnO film provided on the compound-semiconductor film; and
    an n-type ZnO film provided on the non-doped ZnO film.

11. The photodiode according to claim 6, wherein the buffer layer has an opposite conductivity type to the light-absorbing layer, and is made of Cds, ZnS, ZnO, ZnMgO, ZnSe, or $In_2S_3$.

12. The photodiode according to claim 6, comprising a mesa structure in configuration of part of the surface layer, the buffer layer, and the upper electrode layer.

13. A photodiode comprising:
    a light-absorbing layer composed of a compound-semiconductor film of chalcopyrite structure, the compound-semiconductor film of chalcopyrite structure being made of Cu (Inx, Ga1-x) Se2 ($0 \leq x \leq 1$);
    a surface layer disposed on the light-absorbing layer, the surface layer having a higher band gap energy than the compound-semiconductor film;
    an upper electrode layer disposed on the surface layer; and
    a lower electrode layer disposed on a backside of the light-absorbing layer in opposition to the upper electrode layer,
    wherein the upper electrode layer and the lower electrode layer have a reverse bias voltage applied in between to detect electric charges produced by photoelectric conversion in the compound-semiconductor film of chalcopyrite structure, and
    wherein the surface layer is made of Inx, Ga1-xSe ($0 \leq x \leq 1$), and a particle size of the surface layer is smaller than that of the compound-semiconductor film of chalcopyrite structure.

* * * * *